(12) United States Patent
Tanaka et al.

(10) Patent No.: US 7,729,400 B2
(45) Date of Patent: Jun. 1, 2010

(54) EXTERNAL CAVITY TYPE SEMICONDUCTOR LASER

(75) Inventors: Tomiji Tanaka, Saitama (JP); Kazuo Takahashi, Tokyo (JP); Motonobu Takeya, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/579,903

(22) PCT Filed: Nov. 30, 2004

(86) PCT No.: PCT/JP2004/018101

§ 371 (c)(1),
(2), (4) Date: Nov. 15, 2006

(87) PCT Pub. No.: WO2005/055380

PCT Pub. Date: Jun. 16, 2005

(65) Prior Publication Data

US 2007/0064755 A1 Mar. 22, 2007

(30) Foreign Application Priority Data

Dec. 3, 2003 (JP) ............................. 2003-404693

(51) Int. Cl.
*H01S 5/18* (2006.01)
*H01S 5/16* (2006.01)

(52) U.S. Cl. ...................... 372/43.01; 372/102; 372/103

(58) Field of Classification Search ............... 372/43.01, 372/103, 102

See application file for complete search history.

(56) References Cited

U.S. PATENT DOCUMENTS 4,913,525 A * 4/1990 Asakura et al. ............. 359/559

(Continued)

FOREIGN PATENT DOCUMENTS

EP 1 691 458 A1 8/2006

(Continued)

OTHER PUBLICATIONS

European Search Report; Application No./Patent No. 04799951.1-2222 PCT/JP2004018101; Dated: Aug. 7, 2007.

(Continued)

*Primary Examiner*—Minsun Harvey
*Assistant Examiner*—Michael Carter
(74) *Attorney, Agent, or Firm*—Rader Fishman & Grauer PLLC

(57) ABSTRACT

An external cavity type semiconductor laser that has a larger output and a more excellent single mode characteristic than a conventional external cavity type semiconductor laser is provided. The external cavity type semiconductor laser has a laser diode 11, a window glass 16, a grating, and a lens. The external cavity type semiconductor laser has several modifications over the conventional one. A first modification is that the window glass 16 is inclined to a beam emission surface 19 of a laser diode 11 for a predetermined angle. A second modification is that arrangements of the laser diode 11 and so forth are adjusted so that a S wave reaches the grating. A third modification is that when an output power of the laser diode 11 is 45 mW or less, a kink is suppressed. The other modifications are that a reflectance of a beam emission surface of the laser diode 11, a numerical aperture of the lens, an external cavity length, and a reflectance of a first order beam of the grating are optimized to their proper values.

15 Claims, 11 Drawing Sheets

U.S. PATENT DOCUMENTS

| | | | | |
|---|---|---|---|---|
| 5,870,417 | A | * | 2/1999 | Verdiell et al. ............... 372/32 |
| 6,488,419 | B2 | * | 12/2002 | Kato et al. .................. 385/93 |
| 7,027,469 | B2 | * | 4/2006 | Sidorin et al. ............... 372/20 |

FOREIGN PATENT DOCUMENTS

| | | |
|---|---|---|
| JP | 60-92681 | 5/1985 |
| JP | 62-90990 | 4/1987 |
| JP | 2002-131583 | 5/2002 |
| JP | 2002-148492 | 5/2002 |
| JP | 2003-283036 | 10/2003 |

OTHER PUBLICATIONS

T. Mizuno et al "100mW Kink-free Blue-violet Laser Diodes with Low Aspect Ratio" Proceedings of the 11$^{th}$ Sony Research Forum (2001) pp. 201-206.

L. Ricci et al., "A compact grating-stabilized diode laser system for atomic physics", Optics Communications 117, pp. 541-549, Jun. 15, 1995.

Lars Hildebrandt et al., "Antireflection-coated blue GaN laser diodes in an external cavity and Doppler-free indium absorption spectroscopy", Applied Optics, vol. 42, No. 12, pp. 2210-2218, Apr. 20, 2003.

T. Mizuno et al "100mW Kink-free Blue-violet Laser Diodes with Low Aspect Ratio" Soney Research Forum (2001) pp. 201-206.

English Language Translation of Notification of Reasons of Refusal dated Jun. 12, 2007, issued in Japanese Application No. 2003-404693.

Notification of Reasons of Refusal dated Jun. 12, 2007, issued in Japanese Application No. 2003-404693.

International Search Report mailed Mar. 1, 2005.

Takashi Mizuno, et al., "100mW Kink Free, Tei-Aspect-hi Aomurasakiiro Handotai Laser," Proceeding of the 11$^{th}$ Sony Research Forum 2001, pp. 201-206.

* cited by examiner

FIG. 7
Fig. 7A
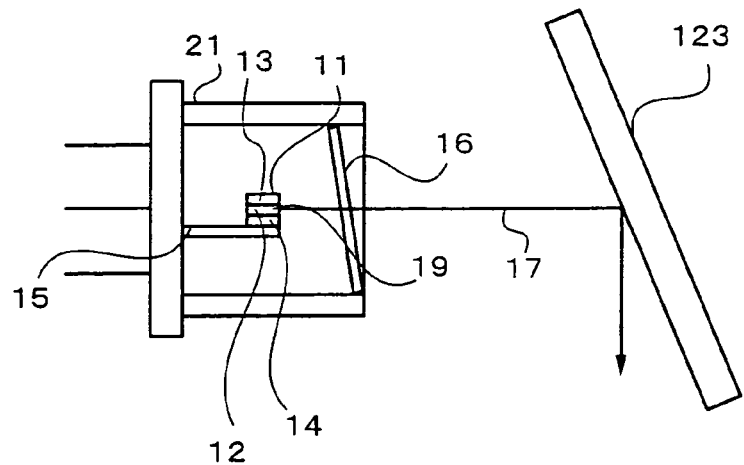
Fig. 7B
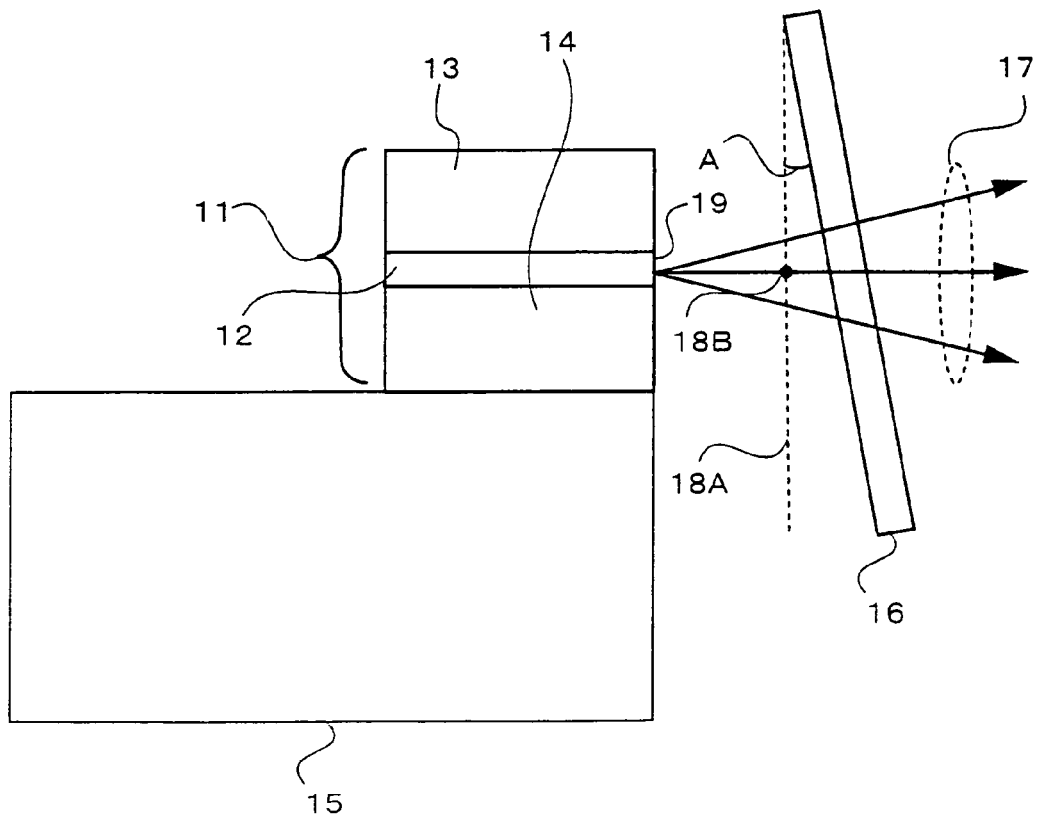

FIG. 8
Fig. 8A
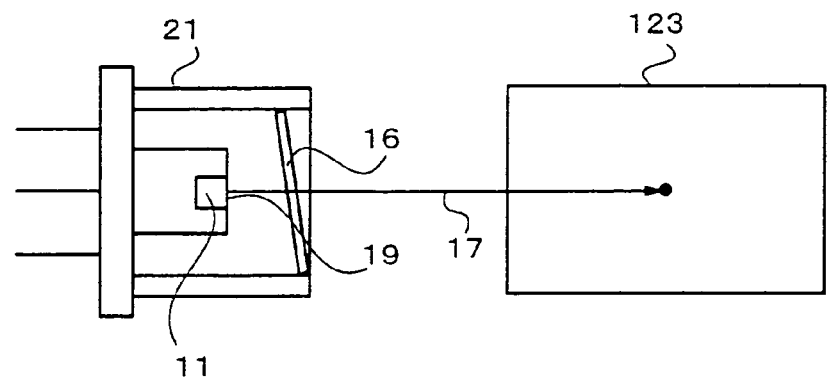
Fig. 8B
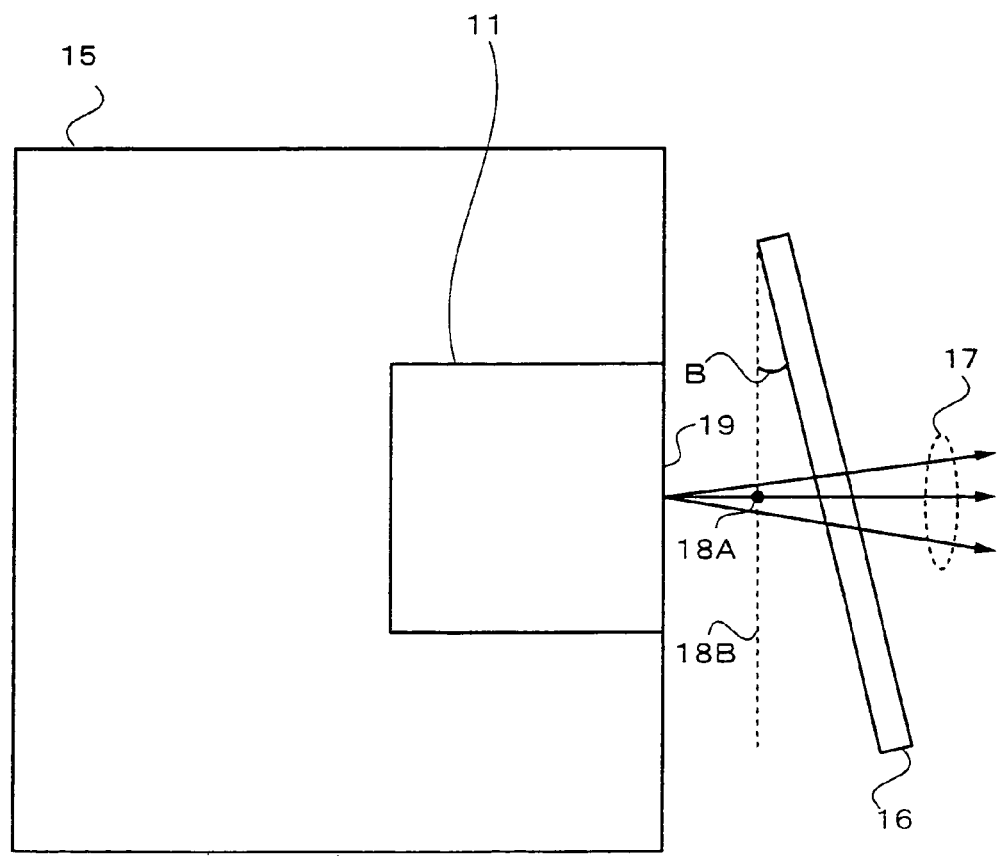

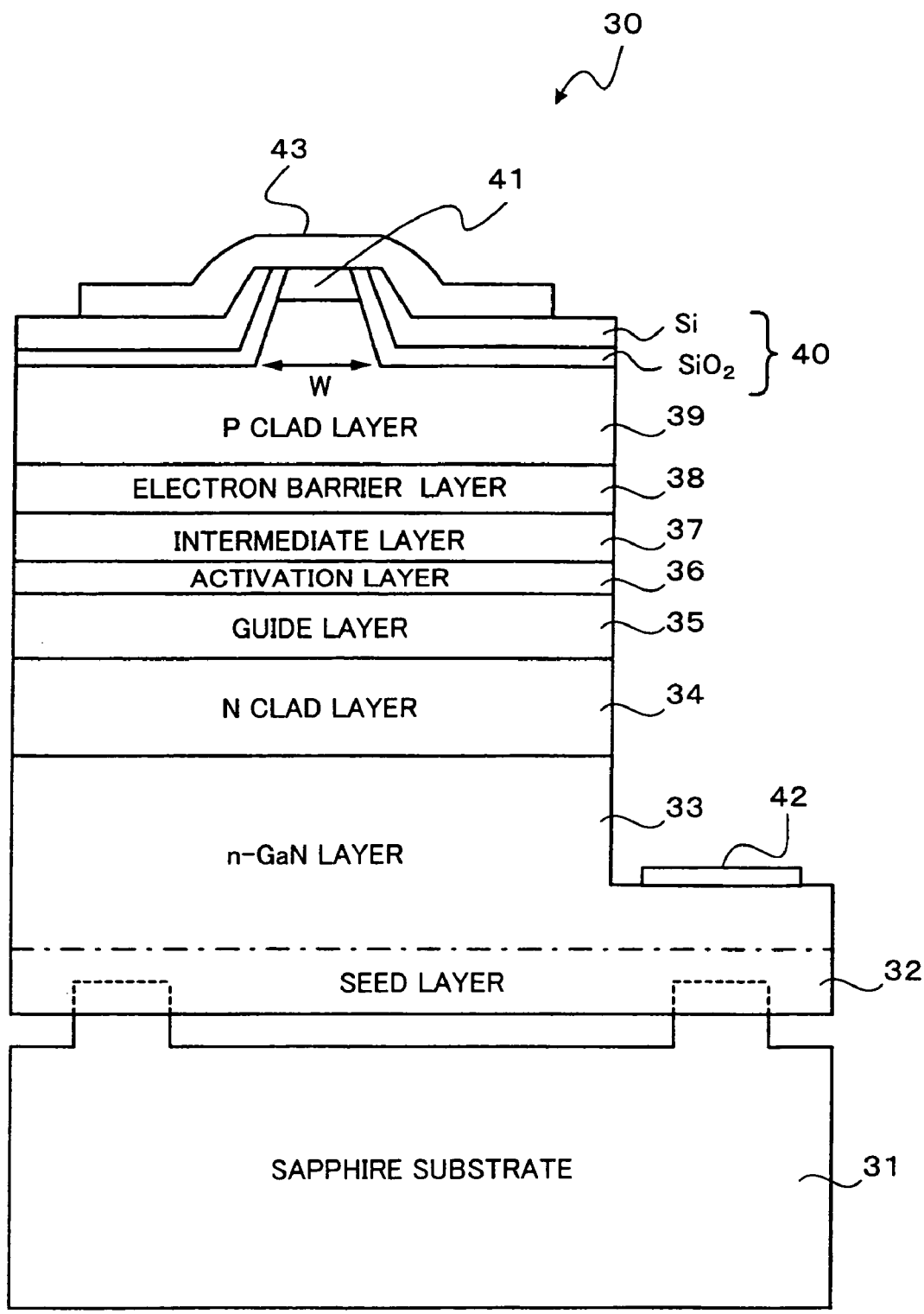

EXTERNAL CAVITY TYPE SEMICONDUCTOR LASER

TECHNICAL FIELD

The present invention relates to an external cavity type semiconductor laser that has a blue laser diode.

BACKGROUND ART

In recent years, since semiconductor lasers are small and have low power consumption, they have been used for many information devices. Among them, there is an external cavity type semiconductor laser that emits a beam whose wavelength is stabilized by an external beam having a predetermined wavelength.

Next, with reference to FIG. 1, a typical Littrow type semiconductor laser will be described. A multiple longitudinal mode laser beam emitted from a semiconductor laser device, such as a laser diode 100, is collimated by a lens (collimate lens) 101. The collimated beam reaches a grating 102. The grating 102 outputs a beam having a predetermined wavelength as a first order diffracted beam 103 corresponding to an arrangement angle of the grating 102. The first order diffracted beam 103 is reversely injected into the laser diode 100 through the lens 101. As a result, the laser diode 100 resonates with the injected first order diffracted beam and emits a single mode beam. The wavelength of the beam emitted from the laser diode 100 is the same as the wavelength of the first order diffracted beam 103 outputted from the grating 102. The rest of the laser beam that has reached the grating 102 is a 0-th order beam 104. The 0-th order beam 104 is reflected at the same angle as the incident angle.

Next, with reference to FIG. 2 and FIG. 3, a structure of a laser system that has a typical external cavity type semiconductor laser that is commercially available will be described. FIG. 2 is a plan view showing a laser system 120. FIG. 3 is a front view showing the laser system 120 seen toward a direction denoted by C in FIG. 2. The structure of the laser system 120 is the same as that of a laser system described in a periodical, L. Ricci, et al. "A compact grating-stabilized diode laser system for atomic physics", Optics Communications, 117 1995, pp 541-549.

The laser system 120 shown in FIG. 2 and FIG. 3 is composed of a laser section 130 that has a laser diode 121, a lens (collimate lens) 122, a grating 123, a first supporting portion 124, a first screw 125, a first groove 126, a second supporting portion 127, a second screw 128, and a second groove 129; a Peltier device 141; and a temperature control section 143 that has a heat sink 142.

As are clear from FIG. 2 and FIG. 3, optical parts such as the lens 122 and the grating 123 are horizontally arranged on a mounting surface of the laser system 120. An optical path of a laser beam is nearly in parallel with the mounting surface. The temperature control section 143 is disposed below the laser section 130. The temperature control section 143 controls temperatures of structural components of the laser section 130 such as the laser diode 121 and the lens 122. The temperature control section 143 keeps the temperature of the laser diode 121 constant. As a result, a light source, which is the laser diode 121, is stabilized.

As shown in FIG. 1, when the arrangement angle of the grating 123 of the laser system 120 is changed, a wavelength of the first order diffracted beam that travels from the grating 123 to the laser diode 121 varies. As a result, a wavelength of an oscillated beam of the laser diode 121 is adjusted. A 0-th order beam D reflected on the grating 123 is emitted to the outside.

The grating 123 is held by the first supporting portion 124. The first supporting portion 124 has the first groove 126. When the first screw 125 mounted in the first supporting portion 124 is rotated, a gap of the first groove 126 is partly widened or narrowed. As a result, a horizontal arrangement angle of the grating 123 slightly varies.

The similar mechanism that adjusts a vertical angle of the grating 123 is disposed. The first supporting portion 124 that supports the grating 123 is supported by the second supporting portion 127. The second supporting portion 127 has the second groove 129. Likewise, when the second screw 128 mounted in the second supporting portion 127 is rotated, a gap of the second groove 129 is partly widened or narrowed. As a result, a vertical arrangement angle of the first supporting portion 124 and the grating 123 slightly varies.

Blue laser diodes as laser diodes 121 have been developed by several makers. These makers have begun using these laser diodes for optical discs and so forth. In addition, as described above, an external cavity type laser system has been used for a holography memory writer that needs a single mode laser beam.

The maximum output of a commercially available laser system of the same type is up to 15 mW as a catalog value.

However, when the external cavity type semiconductor laser is used for a holography memory writer and so forth, a laser output of 30 mW or higher is needed. Conventional external cavity type semiconductor lasers have not yet accomplished such an output level.

The external cavity type semiconductor lasers accomplish a single mode with an external cavity. However, they may not accomplish a sufficient single mode characteristic due to various factors.

Therefore, an object of the present invention is to provide an external cavity type semiconductor laser that has the two features of a larger output and a more excellent single mode characteristic than conventional external cavity type semiconductor lasers or an external cavity type semiconductor laser having one of these features.

Another object of the present invention is to provide an external cavity type semiconductor laser that has a laser beam output of 30 mW or higher and that is capable of being used for a holography memory writer and so forth.

DISCLOSURE OF THE INVENTION

The present invention is an external cavity type semiconductor laser, comprising: a semiconductor laser device having a plurality of layers including an activation layer; a window glass disposed opposite to a beam emission surface of the semiconductor laser device; a grating that receives a beam emitted from the semiconductor laser device through the window glass and returns a beam having a predetermined wavelength to the semiconductor laser device; and a lens disposed between the semiconductor laser device and the grating and which collects the beam emitted from the semiconductor laser device, wherein the window glass is arranged in a first state or a second state, in the first state the window glass is in parallel with a first axis nearly perpendicular to a surface that is in parallel with at least one of the boundary surfaces of the activation layer and other layers of the semiconductor laser device, the window glass being nearly in parallel with at least one of the boundary surfaces of the activation layer and the other layers of the semiconductor laser device, the window glass being nearly in parallel with the beam emission surface of the semiconductor laser device, the window glass being not in parallel with a second axis perpendicular to the first axis, and in the second state the window glass is not in parallel with the first axis, the window glass being nearly in parallel with the second axis.

The present invention is an external cavity type semiconductor laser, comprising: a laser diode having a plurality of layers including an activation layer; a window glass disposed opposite to a beam emission surface of the laser diode; a grating that receives a beam emitted from the laser diode through the window glass and returns a beam having a predetermined wavelength to the laser diode; and a lens disposed between the laser diode and the grating and which collects the beam emitted from the laser diode, wherein the window glass is arranged in a first state or a second state, in the first state the window glass is in parallel with a first axis nearly perpendicular to a surface that is in parallel with at least one of boundary surfaces of the activation layer and other layers of the laser diode, the window glass being nearly in parallel with at least one of the boundary surfaces of the activation layer and the other layers of the laser diode, the window glass being nearly in parallel with the beam emission surface of the laser diode, the window glass being not in parallel with a second axis perpendicular to the first axis, and in the second state the window glass is not in parallel with the first axis, the window glass being nearly in parallel with the second axis, wherein the laser diode and the grating are arranged so that the laser diode supplies an S wave to the grating, wherein the laser diode has an output power of at least 45 mW, wherein when the laser diode emits a beam with an output power of 45 mW or less, a kink does not occur, wherein a reflectance of a beam emission surface of the laser diode is 3% or less, wherein a numerical aperture of the lens is in the range from 0.3 to 0.7, wherein an external cavity length is in the range from 10 mm to 30 mm, and wherein a reflectance of a first order diffracted beam of the grating is in the range from 10% to 30%.

BRIEF DESCRIPTION OF DRAWINGS

FIG. 7 is a schematic diagram showing an example of the external cavity type semiconductor laser according to the present invention.

FIG. 8 is a schematic diagram showing another example of the external cavity type semiconductor laser according to the present invention.

FIG. 11 is a schematic diagram showing an example of a structure of a laser diode that suppresses the occurrence of a kink.

BEST MODES FOR CARRYING OUT THE INVENTION

Figure 1:
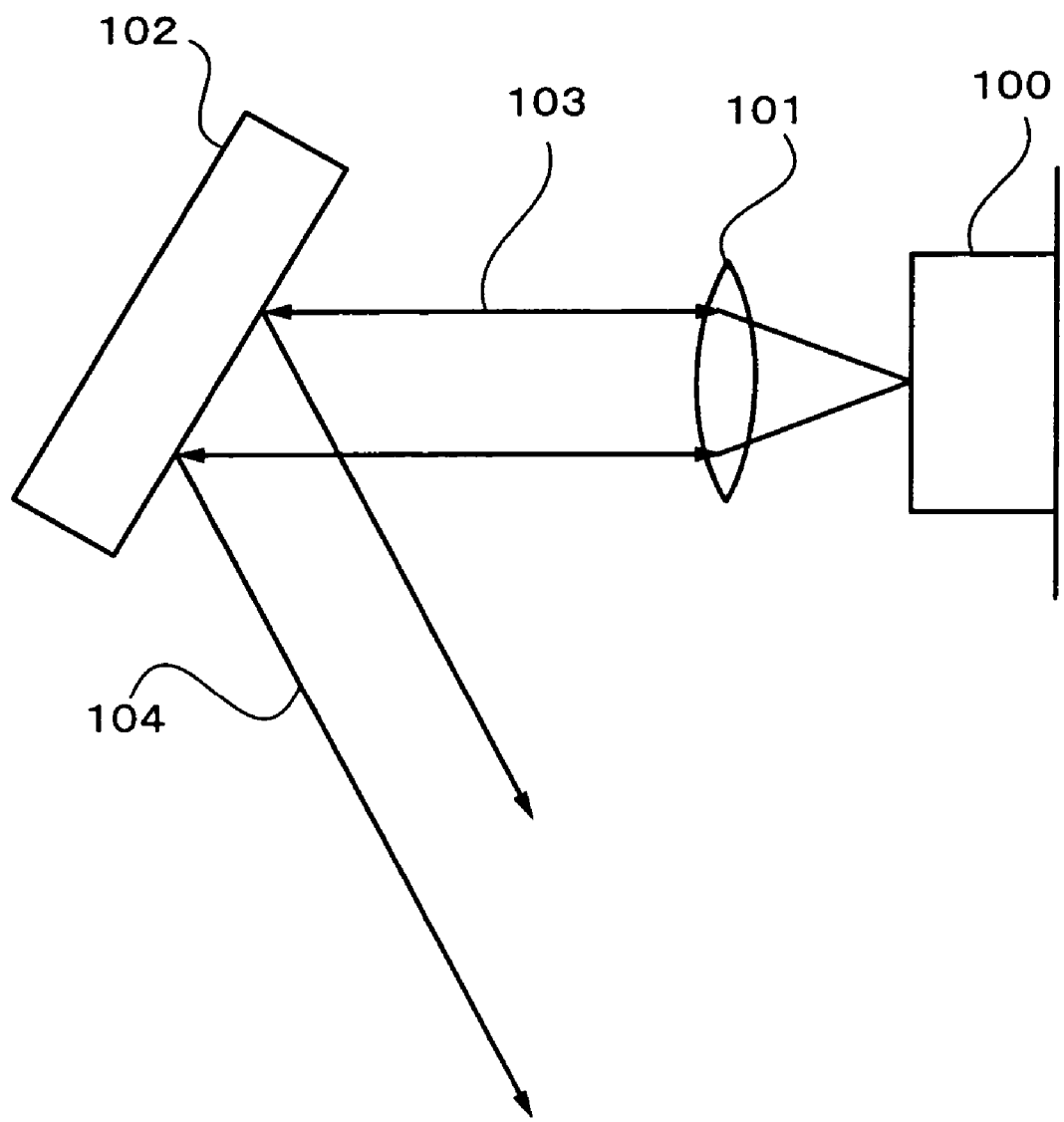
FIG. 1 is a schematic diagram describing a theory of operation of an external cavity type semiconductor laser.

The present invention is a modified external cavity type semiconductor laser that has a semiconductor laser device so as to increase a laser output and improve a single mode characteristic. In this example, the external cavity type semiconductor laser is an apparatus that has, for example, a semiconductor laser using a semiconductor laser device such as a laser diode, a lens, and a grating disposed at positions shown in FIG. 1. The laser diode is, for example, a blue laser diode that emits a beam having a wavelength ranging from, for example, 395 nm to 415 nm. Next, the modifications in the present invention will be successively described.

[1. Optimization of Inclined Angle of Window Glass—Suppression of Multiple Reflection]

Figure 4:
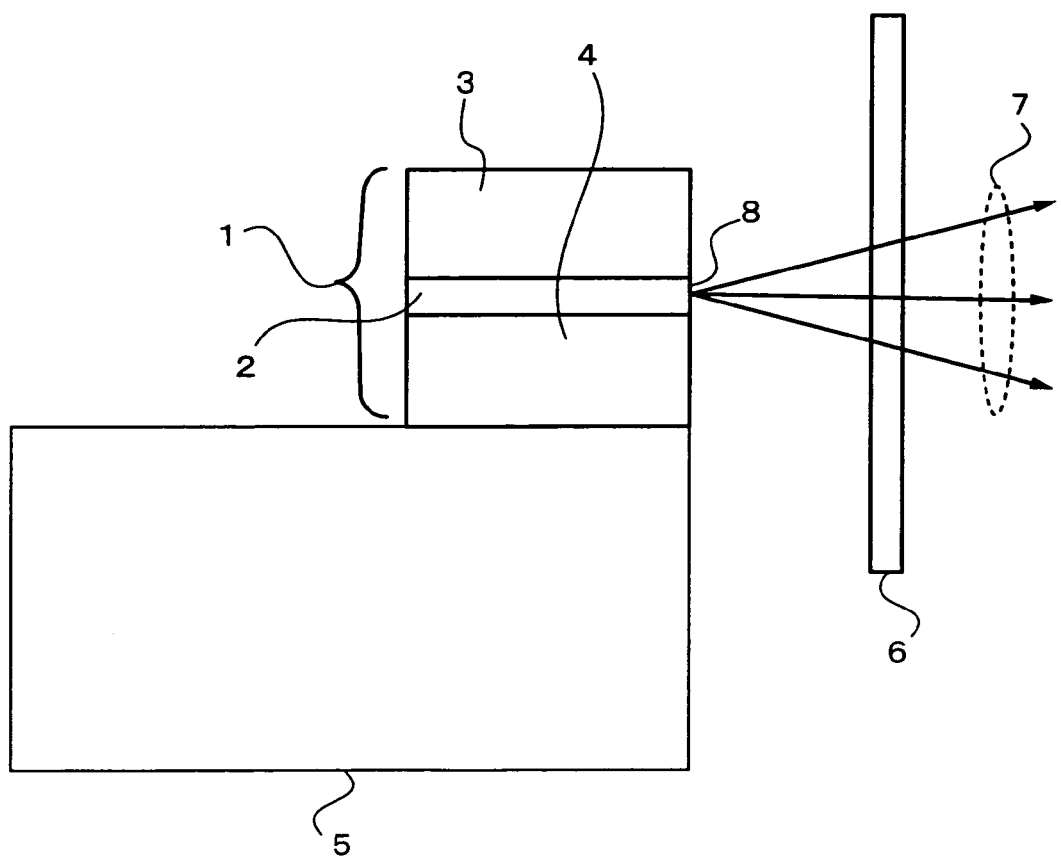
FIG. 4 is a schematic diagram showing a conventional laser diode and associated parts.

As a first modification, a window glass of the semiconductor laser is inclined in a predetermined direction for a predetermine angle. FIG. 4 shows a conventional laser diode (semiconductor laser device) 1 and associated structural parts thereof. The laser diode 1 is composed of an activation layer 2 that contains a laser beam emission portion and two layers 3 and 4 disposed above and below the activation layer 2. The layer 3 is composed of, for example, a P type clad layer, a contact layer, and so forth. The layer 4 is composed of, for example, an N type clad layer, a guide layer, and so forth. To accomplish a low aspect ratio of the semiconductor laser device, an electron barrier layer and an intermediate layer may be disposed between the P type clad layer and the activation layer 2.

A heat sink 5 is disposed below the laser diode 1. The heat sink 5 diffuses heat generated from the laser diode 1 that operates by thermal conduction. The heat sink 5 needs to be made of a material that has high heat conduction, high electric insulation, and high thermal expansion.

A laser beam 7 is emitted from a beam emission surface 8 of the activation layer 2 to the outside through a window glass 6. An external cavity type semiconductor laser that has a red laser diode or the like does not need the window glass 6. However, when an external cavity type semiconductor laser that has a blue laser diode does not use the window glass 6, the laser diode may deteriorate. To prevent that, the window glass 6 shields the laser diode 1 from atmospheric air.

Figure 2:
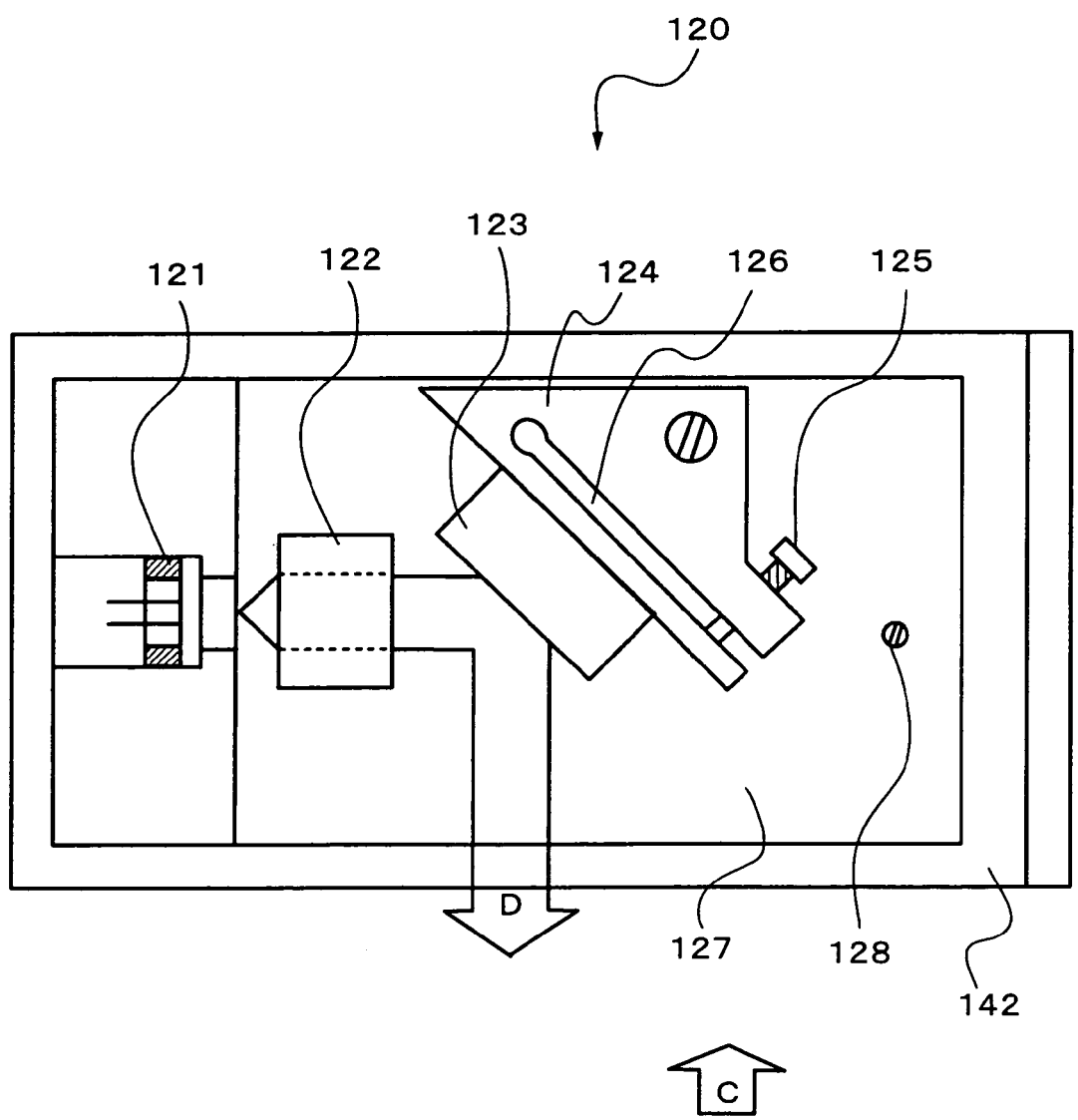
FIG. 2 is a schematic diagram showing a structure of a conventional laser system.
Figure 3:
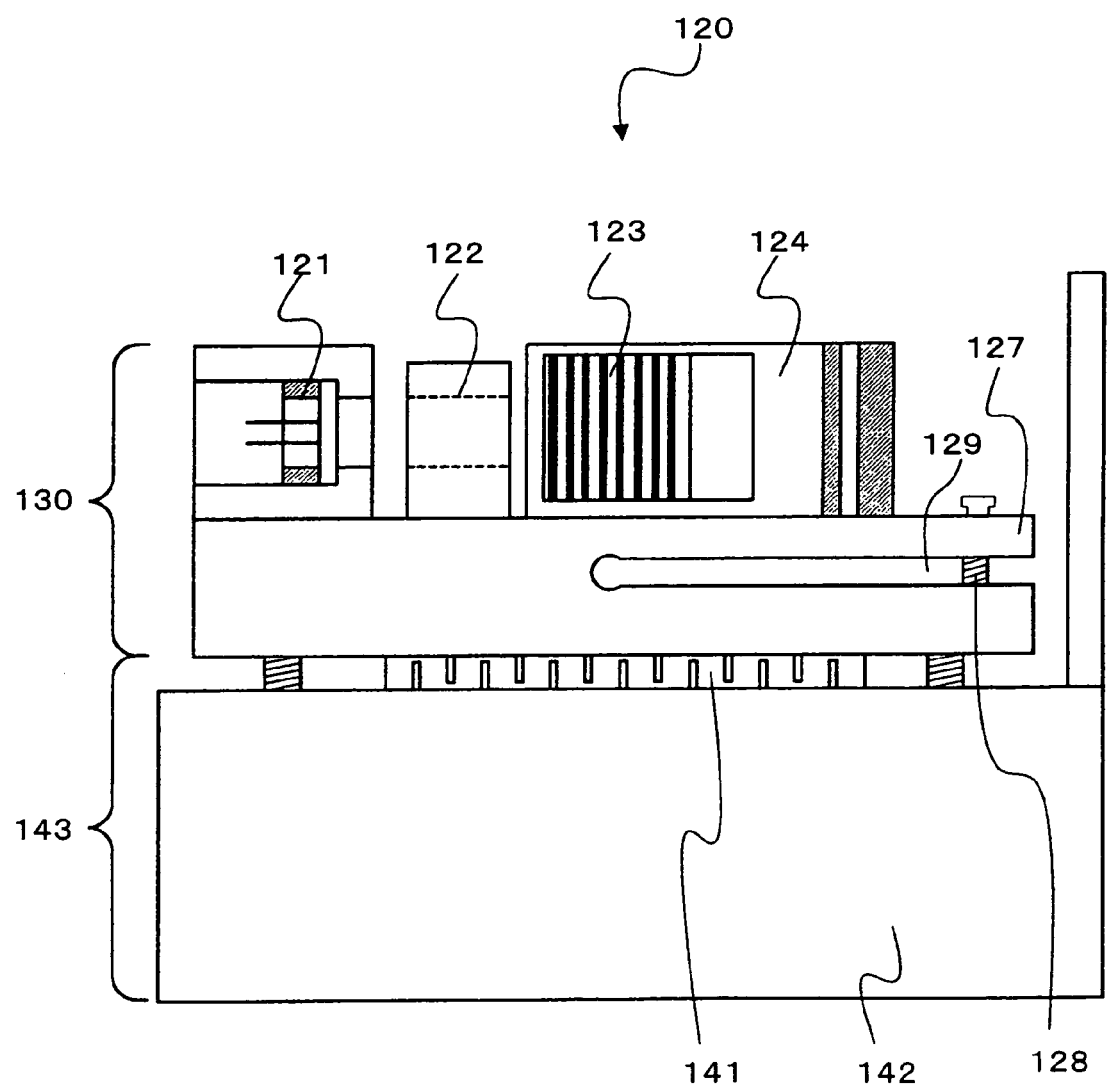
FIG. 3 is a schematic diagram showing a structure on one side of the laser system shown in FIG. 2.
Figure 5:
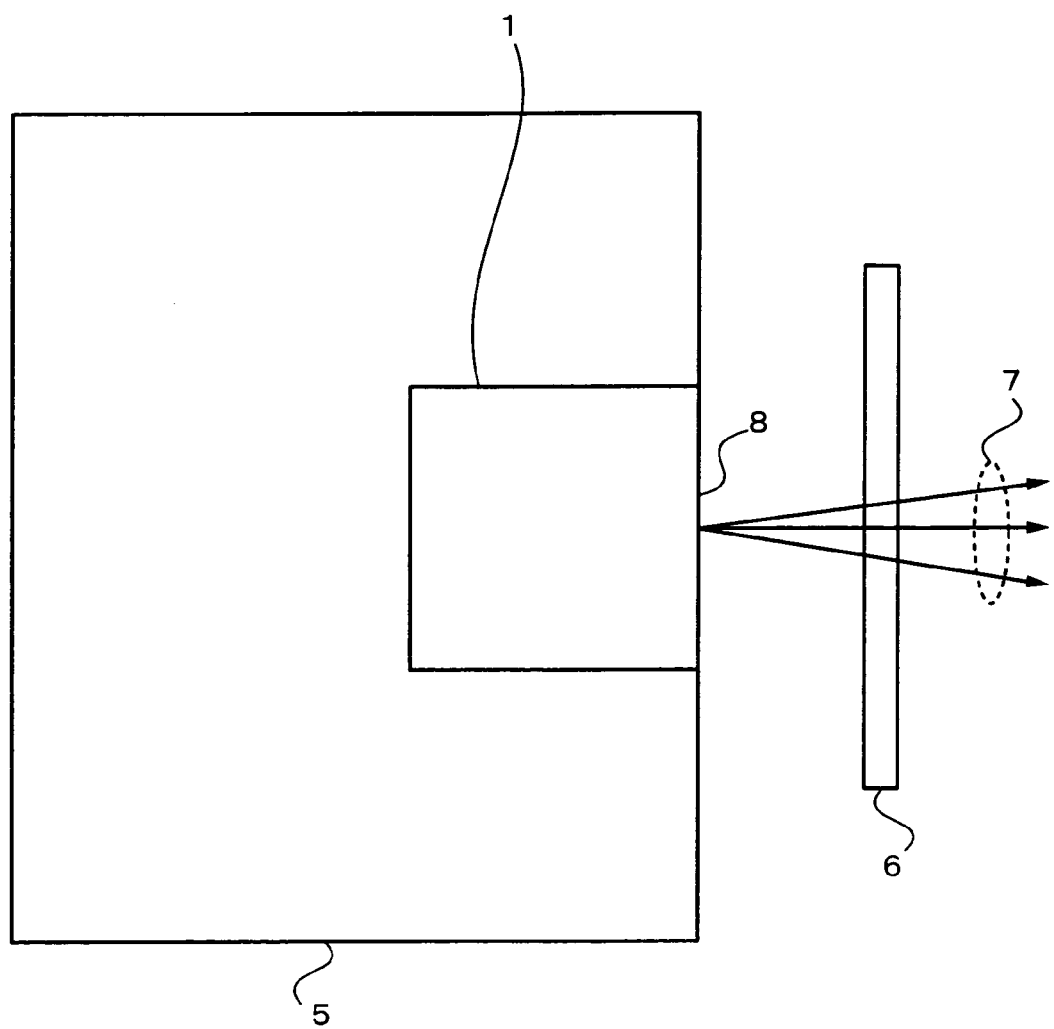
FIG. 5 is a schematic diagram showing the laser diode and the associated parts seen from a different angle than the angle shown in FIG. 4.

FIG. 5 shows the laser diode 1, the heat sink 5, the window glass 6, and so forth seen from an angle different than the angle shown in FIG. 4. FIG. 4 is a plan view of these parts, whereas FIG. 5 is a front view thereof. In other words, a structure of the laser diode 121 of the laser system 120 shown in FIG. 2 is shown in FIG. 4, whereas a structure of the laser diode 121 of the laser system 120 shown in FIG. 3 is shown in FIG. 5. The laser beam 7 is emitted from the laser diode 1 to the outside through the window glass 6. When the shape of the beam emission surface 8 of the activation layer 2 shown in FIG. 4 is rectangular, since a spread angle of shorter sides becomes large, a sectional shape of the laser beam 7 is normally elliptical.

Figure 6:
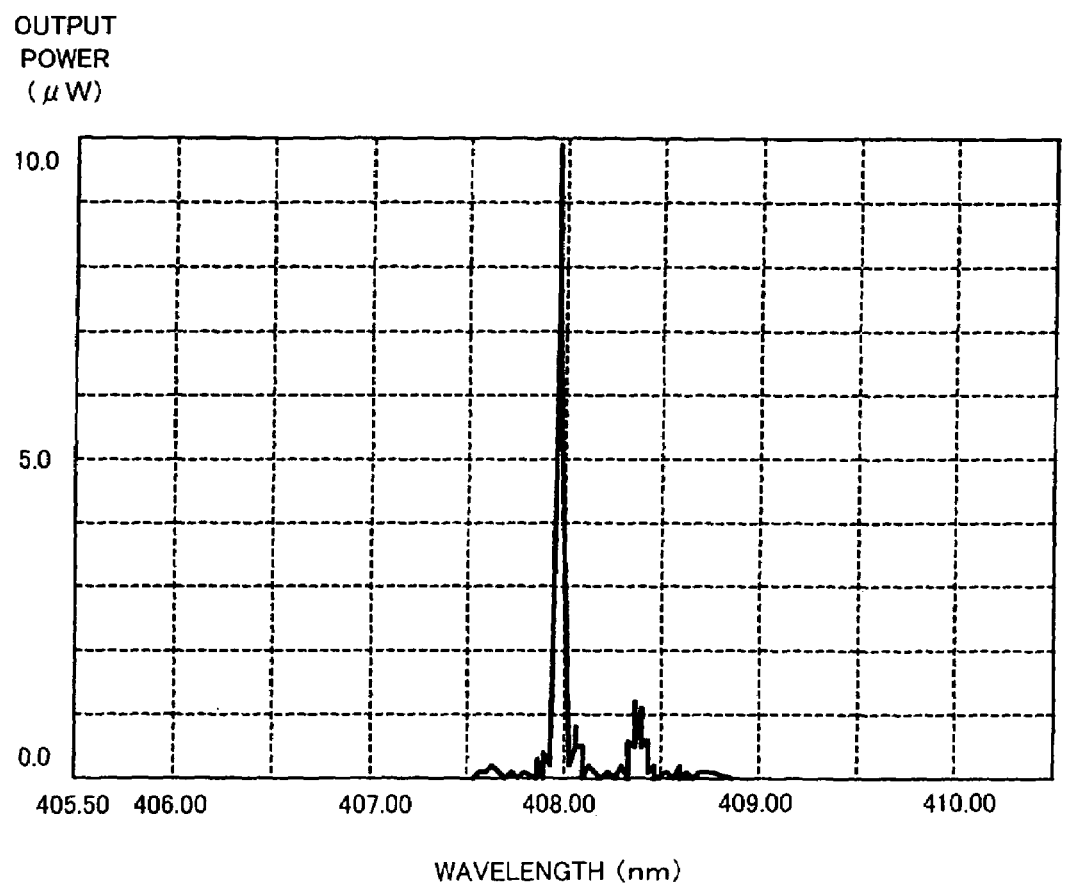
FIG. 6 is a graph showing a relationship between a wavelength and an output power in the case that a single mode is not accomplished.

Conventionally, as shown in FIG. 4 and FIG. 5, since the window glass 6 and the beam emission surface 8 (laser edge surface) of the activation layer 2 are arranged in parallel, the laser beam is reflected by the window glass. Since the laser beam is multiply reflected, the single mode characteristic deteriorates. FIG. 6 shows a relationship between a wavelength and an output power of the laser diode 1 in the case that the single mode characteristic deteriorates. A horizontal axis and a vertical axis of FIG. 6 represent a wavelength (nm) and an output power (µW), respectively. A value on the vertical axis represents a power of a beam that an optical fiber as an input portion of a measurement instrument receives. This value is around one of several thousands of a value of a power of a beam that the laser actually emits.

As shown in FIG. 6, the output power peaks at a wavelength of around 408.00 nm. This portion shows that the beam has a good single mode characteristic. However, there are several laser beams having an output power of 0.1 µW (max) at wavelengths from 408.00 nm to 408.50 nm. As a result, it is clear that a single mode is not accomplished.

Thus, according to the present invention, to suppress multiple reflections due to the window glass, it is inclined in a predetermined direction for a predetermined angle. FIG. 7 shows a first example of a external cavity type semiconductor laser modified in the foregoing manner. In the first example, a laser beam that is emitted from a laser diode 11 and that passes through a window glass 16 reaches in the same direction as that shown in FIG. 4 (namely, as shown in FIG. 7A) a grating 123 inclined as shown in FIG. 2.

The laser diode 11 is composed of an activation layer 12 containing a laser beam emission portion and layers 13 and 14 disposed above and below the activation layer 12. The layer 13 is composed of, for example, a P type clad layer, a contact layer, and so forth. The layer 14 is composed of, for example, an N type clad layer, a guide layer, and so forth. To accomplish a low aspect ratio of the semiconductor laser device, an electron barrier layer and an intermediate layer may be disposed between the P type clad layer and the activation layer 12.

A heat sink 15 is disposed below the laser diode 11. The heat sink 15 diffuses heat generated from the laser diode 11 that operates by thermal conduction. The heat sink 15 needs to be made of a material that has high heat conduction, high electric insulation, and high thermal expansion.

A laser beam 17 is emitted from a beam emission surface 19 of the activation layer 12 to the outside through a window glass 16. An external cavity type semiconductor laser that has a red laser diode or the like does not need the window glass 16. However, when an external cavity type semiconductor laser that has a blue laser diode does not use the window glass 16, the laser diode may deteriorate. To prevent that, the laser diode 11 is airtightly contained in a cylindrical can 21 so that the window glass 16 shields the laser diode 11 from atmospheric air.

FIG. 7B is a schematic diagram showing a first example of the present invention. A first axis 18A shown in FIG. 7B is nearly perpendicular to a surface that is in parallel with at least one of the boundary surfaces of the activation layer 12 and the other layers of the laser diode 11. A second axis 18B is nearly in parallel with at least one of the boundary surfaces of the activation layer 12 and the other layers of the laser diode 11. The second axis 18B is nearly in parallel with the beam emission surface 19 of the laser diode 11. In addition, the second axis 18B is perpendicular to the first axis 18A.

In this example, the surface of the window glass 16 is inclined to the beam emission surface 19 of the laser diode 11 so that the surface of the window glass 16 is in parallel with the second axis 18B, but not in parallel with the first axis 18A. In this example, it is assumed that an angle of the first axis 18A and the window glass 16 is denoted by A. In this example, A is a small angle, for example, 1°.

When the surface of the window glass 16 is inclined to the first axis 18A, for example, e.g. 1.6°, namely, A=1.6°, since wave front aberration is as large as 0.15λP–V (peak to valley), which cannot be practically used. Thus, an allowable range of the inclination angle A of the surface of the window glass 16 is very narrow. In the example shown in FIG. 7B, the window glass 16 is inclined so that an upper portion of the window glass 16 is close to the laser diode 11. Instead, a lower portion of the window glass 16 may be close to the laser diode 11.

Next, the wave front aberration will be described. A beam emitted from a point light source propagates as an equi-phase spherical wave. However, when the optical system has an aberration, the equi-phase wave surface is not a spherical wave in an image space. The deviation from the spherical wave is generally referred to as the spherical aberration. "P–V" means a difference between a top and a bottom of a distortion of a wave front. "0.15λP–V" means that the difference is one wavelength λ, (for example, 410 nm) times 0.15.

FIG. 8 shows a second example in which a window glass is inclined in a predetermined direction for a predetermined angle. As shown in FIG. 8A, in the second example, a laser beam is emitted from a laser diode 11 through a window glass 16 to an inclined grating 123, as shown in FIG. 3. In addition, the laser diode 11 shown in FIG. 8 has a plurality of layers corresponding to the activation layer 11 and the layers 13 and 14 like the laser diode 11 shown in FIG. 7.

FIG. 8B is a schematic diagram showing the second example of the present invention. A first axis 18A shown in FIG. 8B is nearly perpendicular to a surface that is in parallel with at least one of the boundary surfaces of the activation layer and other layers of the laser diode 11. A second axis 18B is nearly in parallel with at least one of the boundary surfaces of the activation layer and the other layers of the laser diode 11. The second axis 18B is nearly in parallel with a beam emission surface 19 of the laser diode 11. In addition, the second axis 18B is perpendicular to the first axis 18A.

In the second example, the surface of the window glass 16 is inclined so that the surface of the window glass 16 is in parallel with the first axis 18A, but not in parallel with the second axis 18B. In this example, it is assumed that an angle of the second axis 18B and the surface of the window glass 16 is denoted by B.

When B is, for example, 5° or larger, since multiple reflection decreases, an excellent single mode characteristic can be obtained. However, when the window glass 16 is excessively inclined, aberration of the window glass 16 becomes large. As a result, an aberration characteristic of the laser deteriorates.

In a region of $1/e^2$, namely, a region of which optical intensity drops to $1/e^2$, to satisfy a wave front aberration of 0.15λP–V or less, an inclination angle of 12° or less is required. To satisfy a wave front aberration of 0.1λP–V or less, an inclination angle of 8° or less is required. In the example shown in FIG. 8, the window glass 16 is inclined so that an upper portion of the window glass 16 is close to the laser diode 11. Instead, the window glass 16 may be inclined so that a lower portion of the window glass 16 is close to the laser diode 11.

As described above, the blue laser diode needs to be shielded from atmospheric air to prevent the diode from deteriorating. Thus, the window glass is an essential structural part. This modification allows an excellent single mode characteristic to be accomplished in the foregoing structure.

Figure 9:
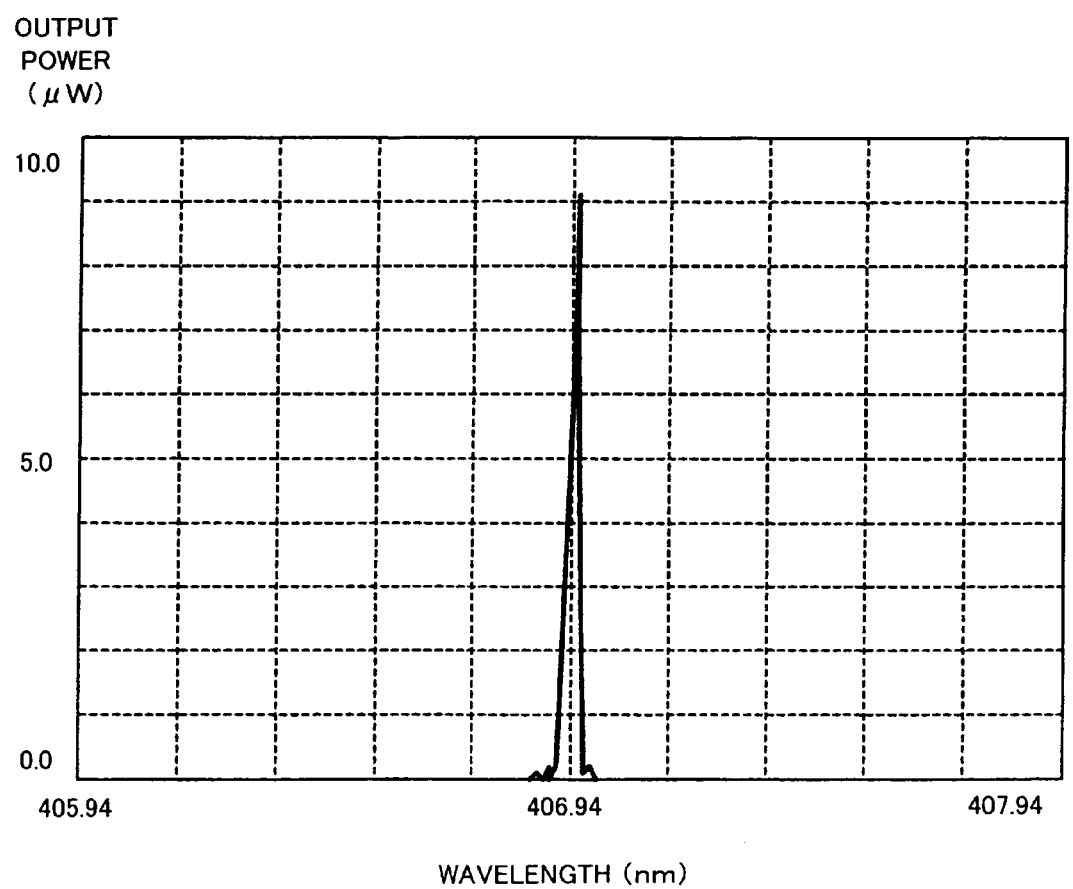
FIG. 9 is a graph showing a relationship between a wavelength and an output power in the case that a single mode is accomplished according to the present invention.

FIG. 9 is a graph showing a relationship between a wavelength and an output power in the case in which the window glass is inclined for 6° in the structure shown in FIG. 8, namely, B=6°. The graph shows that an excellent single mode characteristic is accomplished around a wavelength of 406.94.

[2. Optimization of Incident Wave to Grating—Improvement of Reflectance of Grating]

A laser beam emitted from a laser diode is reflected as a 0-th order beam by a grating. The 0-th order beam exits to the outside. The 0-th order beam is used for various applications, such as a holography memory writer. Thus, it is preferred that the power of the 0-th order beam be large. Since the 0-th order beam is reflected like a mirror, the reflectance thereof largely depends on whether the 0-th order beam is an S wave or a P wave.

A P wave has a Brewstar angle. When the P wave reaches the grating at an inclined angle thereto like the foregoing external cavity type semiconductor laser, the reflectance of the 0-th order beam is low. In contrast, when the S wave reaches the grating at an inclined angle thereto, the reflectance of the 0-th order beam is high. Thus, when the S wave reaches the grating, a large power can be obtained. To allow the S wave to reach to the grating, the arrangements of the semiconductor laser and the grating need to be adjusted with respect to a polarizing direction of the semiconductor laser and a reflecting direction of the grating.

[3. Optimization of Structure of Laser Diode—Removal of Kink]

A light source of a single mode laser beam that is finally obtained is the laser diode 1 shown in FIG. 4. Thus, the laser diode 1 needs to have an output power higher than a required laser power. In other words, the laser diode 1 alone needs to emit a laser beam having a laser power higher than the required laser power in a free run state.

An experiment shows that the power of a laser beam that exits to the outside is around ⅔ of the output power of the laser diode 1 because the laser beam passes through a window glass, a lens (collimate lens), and a grating. When a laser beam is used for a holography memory writer as described above, a power of 30 mW or higher in a single mode is required. An output power required for a laser diode can be obtained by the following formula 1.

$$30 \text{ (mW)} \times 3/2 = 45 \text{ (mW)} \quad \text{(Formula 1)}$$

Most of the remaining ⅓ of the output power of the laser diode 1 returns to the laser diode 1 as a first order diffracted beam of the grating. Thus, this beam does not exit to the outside.

As described above, to obtain a power of 30 mW or higher of a finally obtained single mode laser beam, the laser diode 1 needs to have an output power of 45 mW or higher. However, the output laser beam should be free of a kink in all the power. The kink is a boundary of modes. Before the kink occurs, a beam is emitted in a single lateral mode. After the kink occurs, multiple lateral modes occur. In the multiple lateral mode, it is difficult to accomplish a single mode with an external cavity. Thus, it is preferred that no kink occur in all the power of 45 mW required for the laser diode 1.

Figure 10:
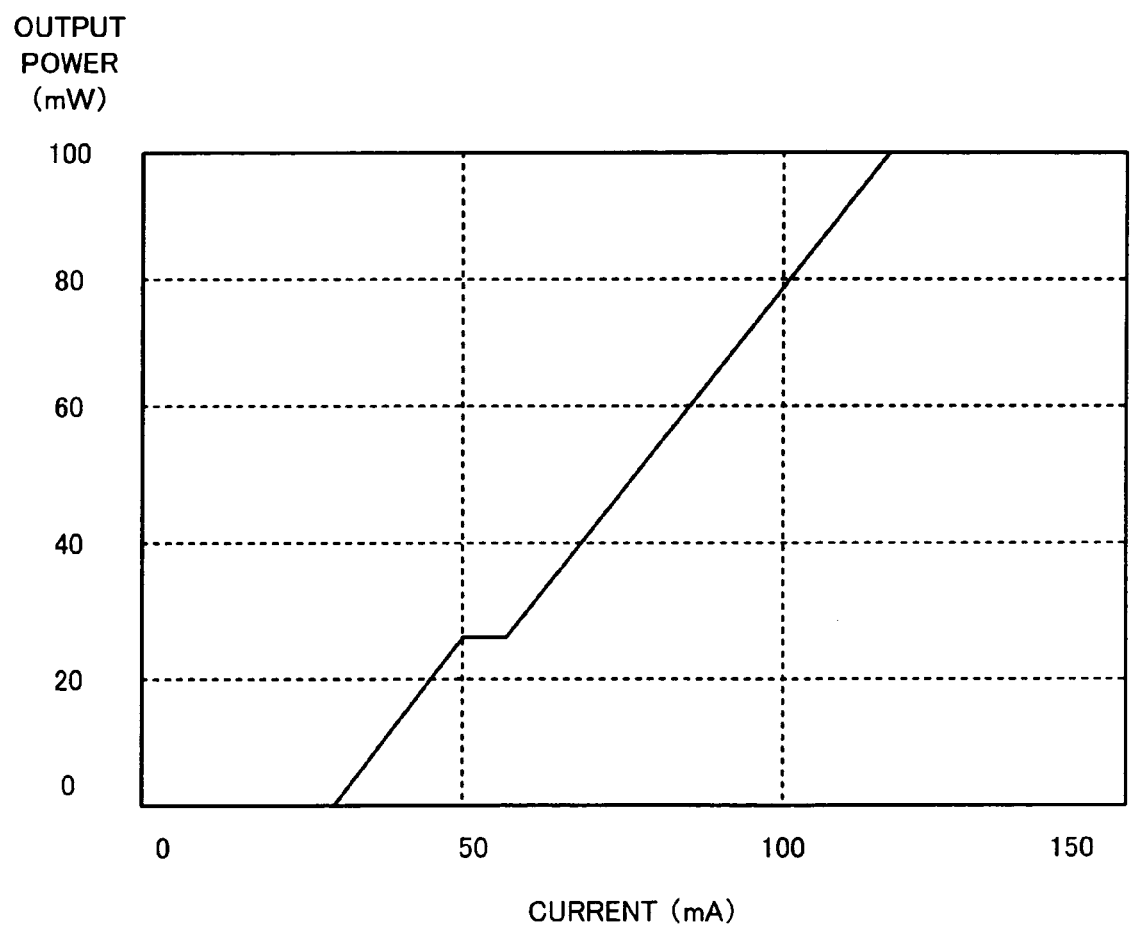
FIG. 10 is a graph showing an example of the occurrence of a kink.

FIG. 10 is a graph showing a relationship between a current (mA) and an output power (mW) of the laser diode 1. In this example, a kink occurs at an output power of around 20 mW. As is clear from the graph, when a current supplied to the laser diode 1 is increased to some extent, the output power of the laser diode 1 is zero. When the current becomes around 30 mA, the output power begins to increase. Thereafter, as the current increases, the output power proportionally increases. However, when the output power becomes around 20 mW (the current becomes around 50 mA), there is a point at which as the current increases, the output power does not increase. This means that while the laser diode 1 outputs a laser beam having the same wavelength, a mode the laser beam that the laser diode 1 emits changes. This point is a kink.

As described above, the kink is undesirable for a single mode. Thus, it is necessary to remove the kink or cause it to occur at an output power of 45 mW or higher.

To do that, a chip of a laser diode 30 is structured as shown in FIG. 11. This structure has been proposed in "100 mW kink-free, low aspect ratio, blue-violet semiconductor laser," Takashi Mizuno, et. al, Proceedings of the 11th Sony Research Forum (2001).

In this structure, an n-GaN layer 33 having a low defect density region is made on a sapphire substrate 31 by ELO (Epitaxial Lateral Overgrowth). Thereafter, an N clad layer 34, a guide layer 35, an activation layer 36, an intermediate layer 37, an electron barrier layer 38, a P clad layer 39, and a contact layer 41 are successively crystallized. In this example, the N clad layer 34 is an n-AlGaN clad layer the guide layer 35 is an n-GaN guide layer the activation layer 36 is a GaInN multiple quantum well activation layer the intermediate layer 37 is a GaInN intermediate layer the electron barrier layer 38 is a p-AlGaN electron barrier layer the P clad layer 39 is a p-GaN/AlGaN ultra-lattice clad layer and the contact layer 41 is a p-GaN contact layer. A P electrode 43 is composed of, for example, Pd/Pt/Au. An N electrode 42 is composed of Ti/Pt/Au.

In this structure, a ridge side surface buried layer 40 is formed. In the ridge side surface buried layer 40, side surfaces of the contact layer (ridge) 41 are buried with two layers of insulation films that are, for example, a $SiO_2$ layer and a Si layer. A single lateral mode laser beam hardly diffuses (spread) in the direction of the boundary of each layer of the laser diode 30, and a multiple lateral mode laser beam diffuses in that direction. Thus, the ridge side surface buried layer 40 hardly absorbs a single lateral mode laser beam, but selectively absorbs a multiple lateral mode laser beam. As a result, a kink is suppressed. At worst, a kink occurs at a high power region.

In this example, it is preferred that a stripe width W corresponding to a width of the contact layer be 1.6 μm or less. When this width is narrow, a multiple lateral mode laser beam hardly occurs.

[4. Optimization of Reflectance of Beam Emission Edge Surface of Laser Diode—Effective Beam Reception of First Order Diffracted Beam]

Since the material of the beam emission portion of the laser diode 1 shown in FIG. 4 has a high refractive index, the beam emission surface 8 reflects a beam that reaches from the outside. However, when the front surface of the beam emission surface 8 is coated, the reflectance can be decreased to almost 0%. The beam emission surface 8 is a surface on which a first diffracted beam returned from the grating to the laser diode 1 is received. The higher the reflectance of the beam emission surface 8 becomes, the lower the received light amount of the first order diffracted beam becomes.

An experimental result shows that a beam emission surface having a reflectance ranging from 0% to 10% accomplishes a single mode laser beam. However, when the beam emission surface has a high reflectance, it is difficult to accomplish a signal mode. In addition, a large part of a first order diffracted beam returned from the grating is wasted. In contrast, when a beam reflection surface having a very low reflectance is required, the yield will decrease due to a coating process. Thus, with respect to these conditions, it is preferred that the reflectance of the beam emission surface of the laser diode 1 be 3% or less.

[5. Optimization of Numerical Aperture of Collimate Lens—Effective Beam Reception of First Order Diffracted Beam]

As shown in FIG. 2 and FIG. 3, a collimate lens is disposed between a laser diode and a grating. When a numerical aperture (NA) of the collimate lens is small, for example, 0.19, a first order diffracted beam returned from the grating is not stopped by the collimate lens. Thus, the first order diffracted beam is spread and received on the beam emission surface 8 of the laser diode. Thus, only a part of the first order diffracted beam is returned to the laser diode. As a result, it becomes difficult to accomplish a single mode.

In contrast, when the numerical aperture of the collimate lens is, for example, 0.4 or 0.6, it is easy to accomplish a single mode. It can be expected that a lens having a numerical aperture that is higher than 0.4 or 0.6 allows a single mode to be accomplished. However, it is difficult to produce a lens having a high numerical aperture. With respect to these conditions, it is preferred that the numerical aperture of the collimate lens be in the range from around 0.3 to 0.7.

[6. Optimization of External Cavity Length]

A distance from a semiconductor laser device, such as a laser diode, to a grating of the external cavity type semiconductor laser shown in FIG. 2 and FIG. 3 is referred to as an external cavity length. Experimental results show that when the external cavity length is 10 mm, 15 mm, 20 mm, 25 mm, and 30 mm, stability is high. Thus, it is preferred that the external cavity length be in the range from 10 mm to 30 mm. In this example, the external cavity length represents an optical distance in consideration of the refractive index and so forth of the window glass and the lens.

In addition, theoretically, the shorter the external cavity length is, the lesser a mode hop of which the current mode changes to another mode occurs. Thus, with respect to these conditions, it is more preferred that the external cavity length be in the range from 10 mm to 20 mm.

[7. Optimization of Reflectance of First Order Diffracted Beam on Grating]

Experimental results show that when gratings that have reflectances of 20% and 40% of a first order diffracted beam are used, nearly the same single mode characteristic is obtained. As described above, a first order diffracted beam is returned to the laser diode to emit a single mode laser beam. Thus, a predetermined light amount of a first order diffracted beam is required. However, when the light amount of the first order diffracted beam is excessive, it will damage the laser diode and decrease an emission beam (0-th order beam). Thus, a proper reflectance is in the range from 10% to 30%.

In the foregoing, an external cavity type semiconductor laser that has a blue laser diode was exemplified. Except for the third modification (optimization of structure of laser diode—removal of kink), all the modifications can be applied to external cavity type semiconductor lasers having another type of a semiconductor laser device.

In addition, the foregoing modifications are to accomplish a larger output and/or a more excellent single mode than a conventional external cavity type semiconductor laser. To accomplish an ideal external cavity type semiconductor laser, it is desired that all the modifications be combined. However, when one or a combination of two or more of the modifications is used, the foregoing object can be accomplished to some extent.

According to the present invention, an external cavity type semiconductor laser having the two features of a larger output and a more excellent single mode characteristic than a conventional external cavity type semiconductor laser or an external cavity type semiconductor laser having one of these two features is provided. In addition, according to the present invention, an external cavity type semiconductor laser having a laser beam output of 30 mW or more and that can be used for a holography memory writer or the like is provided.

DESCRIPTION OF REFERENCE NUMERALS

11, 30 LASER DIODE
12, 36 ACTIVATION LAYER
16 WINDOW GLASS
17 LASER BEAM
40 RIDGE SIDE SURFACE BURIED LAYER

The invention claimed is:

1. An external cavity type semiconductor laser, comprising:
   a semiconductor laser device having an activation layer;
   a grating which receives a beam emitted from the semiconductor laser device; and
   a window glass disposed between a beam emission surface of the semiconductor laser device and the grating, the beam emitted from the semiconductor laser device passing through the window glass;
   wherein the window glass is not parallel with the first axis and nearly parallel with the second axis and, the angle between the surface of the window glass and the first axis is in the range of 1° to 1.6°,
   wherein the first axis is nearly perpendicular to a plane that is nearly parallel with a boundary surface of the activation layer, and
   wherein the second axis is nearly parallel with the beam emission surface of the semiconductor laser device and nearly perpendicular to the first axis.

2. The external cavity type semiconductor laser as set forth in claim 1,
   wherein a lens is disposed between the semiconductor laser device and the grating, the lens collecting the beam emitted from the semiconductor laser device.

3. The external cavity type semiconductor laser as set forth in claim 1,
   wherein the semiconductor laser device and the grating are arranged so that the semiconductor laser device supplies an S wave to the grating.

4. The external cavity type semiconductor laser as set forth in claim 1,
   wherein the semiconductor laser device has an output power of at least 45 mW, and
   wherein, when the semiconductor laser device emits a beam with an output power of 45 mW or less, a kink does not occur.

5. The external cavity type semiconductor laser as set forth in claim 4,
   wherein the semiconductor laser devise is a laser diode, and
   wherein side surfaces of a ridge of the laser diode are buried with two layers of an insulation film to suppress the kink and a stripe width W is 1.6 µm or less.

6. The external cavity type semiconductor laser as set forth in claim 1,
   wherein the semiconductor laser devise is a laser diode, and
   wherein a reflectance of the beam emission surface of the laser diode is 3% or less.

7. The external cavity type semiconductor laser as set forth in claim 1,
   wherein a numerical aperture of the lens is in the range from 0.3 to 0.7.

8. The external cavity type semiconductor laser as set forth in claim 1,
wherein an external cavity length is in the range from 10 mm to 30 mm.

9. The external cavity type semiconductor laser as set forth in claim 1,
wherein the external cavity length is in the range from 10 mm to 20 mm.

10. The external cavity type semiconductor laser as set forth in claim 1,
wherein a reflectance of a first order diffracted beam of the grating is in the range from 10% to 30%.

11. The external cavity type semiconductor laser as set forth in claim 1,
wherein the semiconductor laser device is a blue laser diode.

12. An external cavity type semiconductor laser, comprising:
a laser diode having an activation layer;
a grating which receives a beam emitted from the laser diode;
a window glass disposed between a beam emission surface of the laser diode and the grating, the beam emitted from the laser diode passing through the window glass; and
a lens disposed between the laser diode and the grating, the lens collecting the beam emitted from the laser diode,
wherein the window glass is not parallel with the first axis and nearly parallel with the second axis and, the angle between the surface of the window glass and the first axis is in the range of 1° to 1.6°,
wherein the first axis is nearly perpendicular to a plane that is nearly parallel with a boundary surface of the activation layer, and
wherein the second axis is nearly parallel with the beam emission surface of the laser diode and nearly perpendicular to the first axis,
wherein the laser diode and the grating are arranged so that the laser diode supplies an S wave to the grating,
wherein the laser diode has an output power of at least 45 mW,
wherein when the laser diode emits a beam with an output power of 45 mW or less, a kink does not occur,
wherein a reflectance of the beam emission surface of the laser diode is 3% or less,
wherein a numerical aperture of the lens is in the range from 0.3 to 0.7,
wherein an external cavity length is in the range from 10 mm to 30 mm, and
wherein a reflectance of a first order diffracted beam of the grating is in the range from 10% to 30%.

13. The external cavity type semiconductor laser as set forth in claim 12,
wherein the laser diode is a blue laser diode.

14. The external cavity type semiconductor laser as set forth in claim 12,
wherein side surfaces of a ridge of the laser diode are buried with two layers of an insulation film to suppress the kink and a stripe width W is 1.6 pm or less.

15. The external cavity type semiconductor laser as set forth in claim 12,
wherein the external cavity length is in the range from 10 mm to 20 mm.

\* \* \* \* \*